(12) United States Patent
Feng (10) Patent No.: US 10,209,594 B2
(45) Date of Patent: Feb. 19, 2019

(54) THIN FILM TRANSISTOR ARRAY SUBSTRATE, MANUFACTURING METHOD THEREFOR, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Wei Feng, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/513,172

(22) PCT Filed: Jan. 6, 2016

(86) PCT No.: PCT/CN2016/070257
§ 371 (c)(1),
(2) Date: Mar. 22, 2017

(87) PCT Pub. No.: WO2017/031924
PCT Pub. Date: Mar. 2, 2017

(65) Prior Publication Data
US 2017/0307921 A1    Oct. 26, 2017

(30) Foreign Application Priority Data
Aug. 21, 2015    (CN) .......................... 2015 1 0518773

(51) Int. Cl.
*H01L 27/12* (2006.01)
*H01L 21/768* (2006.01)
(Continued)

(52) U.S. Cl.
CPC .......... *G02F 1/1368* (2013.01); *G02F 1/1343* (2013.01); *G02F 1/13439* (2013.01);
(Continued)

(58) Field of Classification Search
CPC ............. H01L 27/1251; H01L 27/3244; H01L 27/1218; H01L 29/4908; H01L 29/42384;
(Continued)

(56) References Cited

U.S. PATENT DOCUMENTS 6,252,247 B1    6/2001  Sakata et al.
7,973,896 B2 *  7/2011  Lee .................. G02F 1/136213
                                                      349/138

(Continued)

FOREIGN PATENT DOCUMENTS

CN    101621039 A    1/2010
CN    102629051 A    8/2012
(Continued)

OTHER PUBLICATIONS

Jun. 1, 2016—(WO)—International Search Report and Written Opinion Appn PCT/CN2016/070257 with English Tran.
(Continued)

*Primary Examiner* — Julia Slutsker
(74) *Attorney, Agent, or Firm* — Banner & Witcoff, Ltd.

(57) ABSTRACT

A thin film transistor array substrate, a manufacturing method thereof and a display device are provided, and the thin film transistor array substrate includes: a base substrate, a gate electrode disposed on the base substrate, a gate insulating layer and an active layer which are disposed on the gate electrode sequentially, and a pixel electrode, a common electrode, and a transparent electrode layer which are disposed on the base substrate; the transparent electrode layer and the pixel electrode or the common electrode are prepared in a same layer and by a same material; the
(Continued)

transparent electrode layer is disposed under the gate insulating layer; an orthogonal projection of the active layer on the base substrate is located within a region of an orthogonal projection of the transparent electrode layer.

13 Claims, 11 Drawing Sheets (51) Int. Cl.
| | |
|---|---|
| *G02F 1/1368* | (2006.01) |
| *G02F 1/1343* | (2006.01) |
| *G02F 1/1362* | (2006.01) |
| *H01L 29/423* | (2006.01) |
| *H01L 29/49* | (2006.01) |
| *H01L 29/786* | (2006.01) |

(52) U.S. Cl.
CPC .. *G02F 1/134309* (2013.01); *G02F 1/136286* (2013.01); *H01L 21/768* (2013.01); *H01L 27/124* (2013.01); *H01L 27/127* (2013.01); *H01L 27/1218* (2013.01); *H01L 29/42384* (2013.01); *H01L 29/4908* (2013.01); *H01L 29/78603* (2013.01); *G02F 2001/13629* (2013.01); *G02F 2001/136295* (2013.01); *G02F 2201/121* (2013.01); *G02F 2201/123* (2013.01)

(58) Field of Classification Search
CPC ................ H01L 27/124; G02F 1/1368; G02F 1/136286; G02F 2201/123; G02F 2001/13629
See application file for complete search history.

(56) References Cited

U.S. PATENT DOCUMENTS

| | | | | |
|---|---|---|---|---|
| 2005/0270454 | A1* | 12/2005 | Ahn | G02F 1/133555 |
| | | | | 349/114 |
| 2006/0066788 | A1* | 3/2006 | Utsumi | G02F 1/133509 |
| | | | | 349/120 |
| 2009/0284677 | A1 | 11/2009 | Shin et al. | |
| 2011/0012112 | A1* | 1/2011 | Yamazaki | H01L 27/1225 |
| | | | | 257/57 |
| 2013/0016294 | A1 | 1/2013 | Li et al. | |
| 2015/0069336 | A1* | 3/2015 | Okumura | H01L 27/1225 |
| | | | | 257/40 |

FOREIGN PATENT DOCUMENTS

| | | |
|---|---|---|
| CN | 102769040 A | 11/2012 |
| CN | 103293803 A | 9/2013 |
| CN | 104536222 A | 4/2015 |
| CN | 105070727 A | 11/2015 |

OTHER PUBLICATIONS

Jul. 20, 2017—(CN) First Office Action Appn 201510518773.3 with English Tran.
May 29, 2018—(CN) Third Office Action Appn 201510518773.3 with English Translation.
Jan. 2, 2018—(CN) Second Office Action Appn 201510518773.3 with English Tran.

* cited by examiner

THIN FILM TRANSISTOR ARRAY SUBSTRATE, MANUFACTURING METHOD THEREFOR, AND DISPLAY DEVICE

The application is a U.S. National Phase Entry of International Application No. PCT/CN2016/070257 filed on Jan. 6, 2016, designating the United States of America and claiming priority to Chinese Patent Application No. 201510518773.3 filed on Aug. 21, 2015. The present application claims priority to and the benefit of the above-identified applications and the above-identified applications are incorporated by reference herein in their entirety.

TECHNICAL FIELD

Embodiments of the present disclosure relate to a thin film transistor array substrate, a manufacturing method thereof and a display device.

BACKGROUND

At present, a multi-dimensional electric field in an advanced-super dimension switch (ADS) thin film transistor liquid crystal display (LCD) is formed with both an electric field generated by the edges of the electrodes in a shape having slits in a same plane and an electric field generated between a layer of the electrodes in a shape having slits and a layer of the electrodes in a shape of plate, the multidimensional electric field enables all of the liquid crystal molecules disposed between the electrodes in a shape having slits and disposed directly above the electrodes in the liquid crystal cell to rotate. In this way, the working efficiency of the liquid crystals is enhanced, and the transmittance of the liquid crystal display is increased. Therefore, the ADS technology can improve the image quality of thin film transistor liquid crystal displays and has advantages of high resolution, high transmittance, low power consumption, wide viewing angle and so on.

For example, the ADS technology involves that two layers of indium tin oxide (ITO) material are fabricated on the thin film transistor array substrate, one layer of the indium tin oxide material is for a common electrode and the other one is for a pixel electrode. In the ADS technology, the common electrode is manufactured at the lower layer on the base substrate, and the common electrode is designed in a shape of block; the pixel electrode is manufactured on the upper layer, and the pixel electrode is designed in a shape having slits.

SUMMARY

At least one embodiment of the present disclosure provides a thin film transistor array substrate, a manufacturing method thereof and a display device. The residual of the electrode layer in the area where the thin film transistor is located can be reduced, and further the phenomenon of unevenly displayed image caused by the residual can be avoided.

At least one embodiment of the present disclosure provides a thin film transistor array substrate, and the thin film transistor array substrate comprises: a base substrate, a gate electrode disposed on the base substrate, a gate insulating layer and an active layer which are disposed on the gate electrode sequentially, and a pixel electrode, a common electrode, and a transparent electrode layer which are disposed on the base substrate; the transparent electrode layer and the pixel electrode are prepared in a same layer and a material of the transparent electrode layer is the same as a material of the pixel electrode, or the transparent electrode layer and the common electrode are prepared in a same layer and a material of the transparent electrode layer is the same as a material of the common electrode; the transparent electrode layer is disposed under the gate insulating layer; an orthogonal projection of the active layer on the base substrate is located within a region of an orthogonal projection of the transparent electrode layer.

For example, in the thin film transistor array substrate provided in one embodiment of the present disclosure, the transparent electrode layer is disposed between the base substrate and the gate electrode; or the transparent electrode layer is disposed between the gate electrode and the gate insulating layer.

For example, in the thin film transistor array substrate provided in one embodiment of the present disclosure, a buffer layer is disposed between the base substrate and the gate electrode; the transparent electrode layer is disposed between the base substrate and the buffer layer.

For example, the thin film transistor array substrate provided in one embodiment of the present disclosure further comprises: a plurality of gate lines disposed on the transparent electrode layer, and a portion of each of the gate lines is used as the gate electrode.

For example, in the thin film transistor array substrate provided in one embodiment of the present disclosure, an orthogonal projection of the gate line on the base substrate overlaps with the orthogonal projection of the transparent electrode layer on the base substrate.

For example, in the thin film transistor array substrate provided in one embodiment of the present disclosure, the pixel electrode in the thin film transistor array substrate is disposed above the common electrode, and the common electrode is a plate electrode.

For example, in the thin film transistor array substrate provided in one embodiment of the present disclosure, the pixel electrode in the thin film transistor array substrate is disposed under the common electrode, and the pixel electrode is a plate electrode.

For example, in the thin film transistor array substrate provided in one embodiment of the present disclosure, the material of the transparent electrode layer is one or more of indium tin oxide, indium zinc oxide or indium gallium zinc.

For example, in the thin film transistor array substrate provided in one embodiment of the present disclosure, the transparent electrode layer is a plate electrode having a shape of rectangular.

For example, in the thin film transistor array substrate provided in one embodiment of the present disclosure, a thickness of the transparent electrode layer ranges from 300 Å to 1000 Å.

At least one embodiment of the present disclosure further provides a manufacturing method of a thin film transistor array substrate, and the method comprises: forming patterns of a pixel electrode and a transparent electrode layer on a base substrate by a same patterning process; or forming patterns of a common electrode and a transparent electrode layer on a base substrate by a same patterning process; forming a pattern of a gate electrode on the base substrate; and forming patterns of a gate insulating layer and an active layer sequentially on the base substrate formed with the pattern of the gate electrode; the pattern of the transparent electrode layer is disposed under the pattern of the gate insulating layer; an orthogonal projection of the pattern of the active layer on the base substrate is located within a region of an orthogonal projection of the pattern of the transparent electrode layer.

At least one embodiment of the present disclosure provides a display device, and the display device comprises any one of the thin film transistor array substrate provided in the embodiments of the present disclosure.

BRIEF DESCRIPTION OF THE DRAWINGS

In order to clearly illustrate the technical solutions of the embodiments of the present disclosure, the drawings of the embodiments will be briefly described below. Apparently, the drawings described below relate to only some embodiments of the present disclosure, and thus are not limitative of the present disclosure.

REFERENCE NUMERALS

1—base substrate; 2—gate line; 3—transparent electrode layer; 4—active layer; 5—source electrode; 6—drain electrode; 7—common electrode; 8—common electrode line; 9—data scanning line; 10—via hole; 11—connection hole; 12—pixel electrode; 13—conductive connection layer; 20—gate electrode; 30—gate insulating layer; 40—buffer layer; 50—passivation layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Thicknesses and shapes of the film layers in the figures do not reflect real scales of a thin film transistor array substrate, and the figures are only schematic illustrations of the contents of the present disclosure.

Figure 1A:
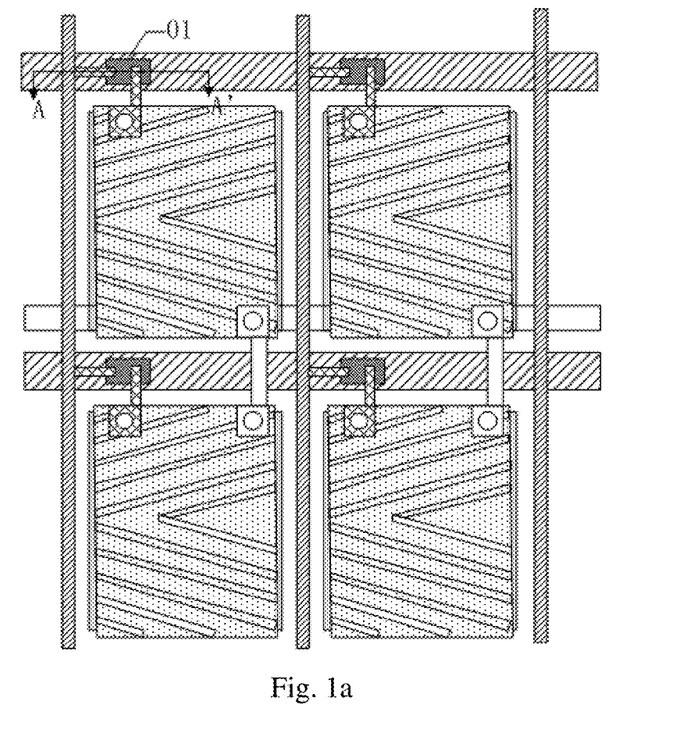
FIG. 1a is a top view of a thin film transistor array substrate.
Figure 1B:
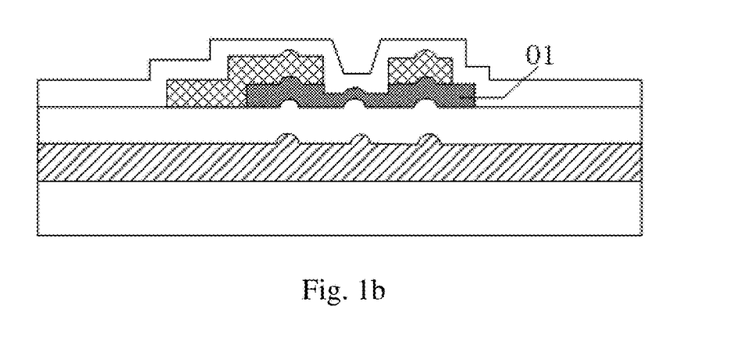
FIG. 1b is a sectional schematic structure diagram of the thin film transistor array substrate illustrated in FIG. 1a along the direction A-A'.

The inventor has noted that in the production process of the ADS products mura on a screen is prone to appear, which seriously affects the yield of the products. By analysis, the mechanism of the defect is, as described as follows, related to the residue (small electrode layer material residues due to etching) of the plate shaped electrode layer (for example, a common electrode), as illustrated in FIG. 1a and FIG. 1b, in an area seriously suffering from notable residues, an active layer 01 of a thin film transistor is easy to be curved so as to become uneven, which brings about the result that the characteristics $I_{off}$ of the thin film transistor is too large, and leads to serious leakage of electricity and an unevenly displayed image.

Figure 2A:
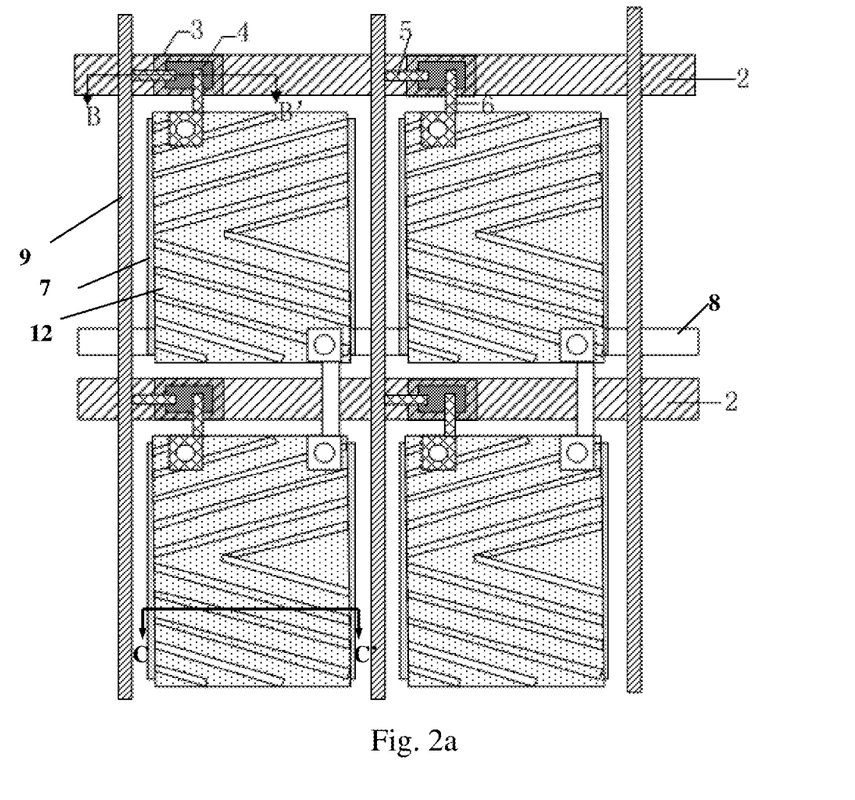
FIG. 2a is a top view of a thin film transistor array substrate provided in an embodiment of the present disclosure.

At least one embodiment of the present disclosure provides a thin film transistor array substrate, as illustrated in FIG. 2a to FIG. 2d, the thin film transistor array substrate comprises: a base substrate 1, a gate electrode 20 disposed on the base substrate 1, and a gate insulating layer 30 and an active layer 4 which are disposed on the gate electrode sequentially. As illustrated in the drawings, the thin film transistor array substrate includes a plurality of horizontally extending gate lines 2, and a plurality of vertically extending data lines 9, the gate lines and the data lines cross with each other to define a plurality of pixel units, each pixel unit includes a pixel electrode 12 and a thin film transistor used as a switching element. The thin film transistor has a gate electrode, a source electrode, a drain electrode, an active layer and a gate insulating layer, the gate insulating layer is interposed between the gate electrode and the active layer, and the source electrode and the drain electrode contact with the active layer, a channel region is defined between the source electrode and the drain electrode, and the channel region corresponds to the gate electrode. The gate electrode is electrically connected with the gate line, or the gate electrode is a part of the gate line (in the example as illustrated in FIG. 2a, the gate electrode is a part of the gate line), one of the source electrode and the drain electrode is electrically connected with the data line or is a part of the data line according to the requirements, and the other one is electrically connected with the pixel electrode.

Accordingly, the thin film transistor array substrate further comprises the pixel electrode 12, a common electrode 7, and a transparent electrode layer 3 which are disposed on the base substrate 1; the transparent electrode layer 3 and the pixel electrode 12 are prepared in a same layer and by a same material, or the transparent electrode layer 3 and the common electrode 7 are prepared in a same layer and by a same material; the transparent electrode layer 3 is disposed under the gate insulating layer 30, and an orthogonal projection of the active layer 4 on the base substrate 1 is located within the region of an orthogonal projection of the transparent electrode layer 3.

In the thin film transistor array substrate provided in an embodiment of the present disclosure, because the transparent electrode layer prepared in a same layer and by a same material as the pixel electrode or the common electrode is disposed directly under the active layer, the residual in the region where the thin film transistor is located can be reduced, in this way, the surface of the active layer is smooth, and the phenomenon of unevenly displayed image caused by the residual can be avoided. The method is simple and has little influence on the gate resistance, so that it can improve the quality of the product.

Figure 2B:
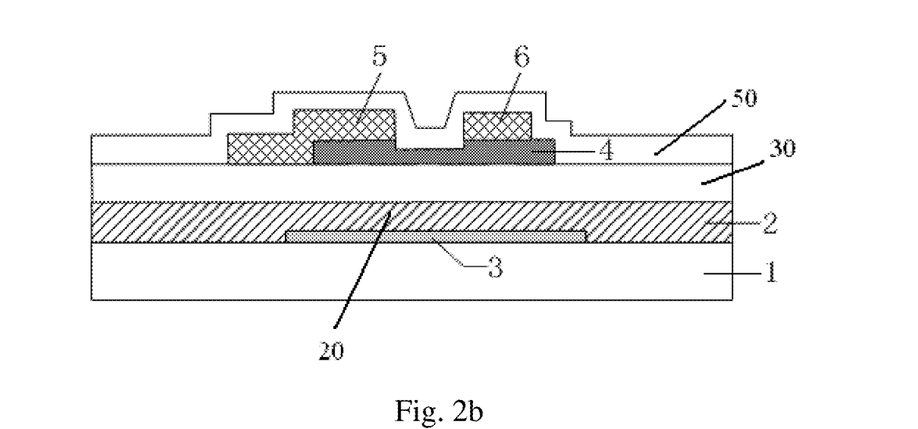
FIG. 2b to FIG. 2d are sectional schematic structure diagrams of the thin film transistor array substrate illustrated in FIG. 2a along the direction B-B' in each embodiment respectively.
Figure 2C:
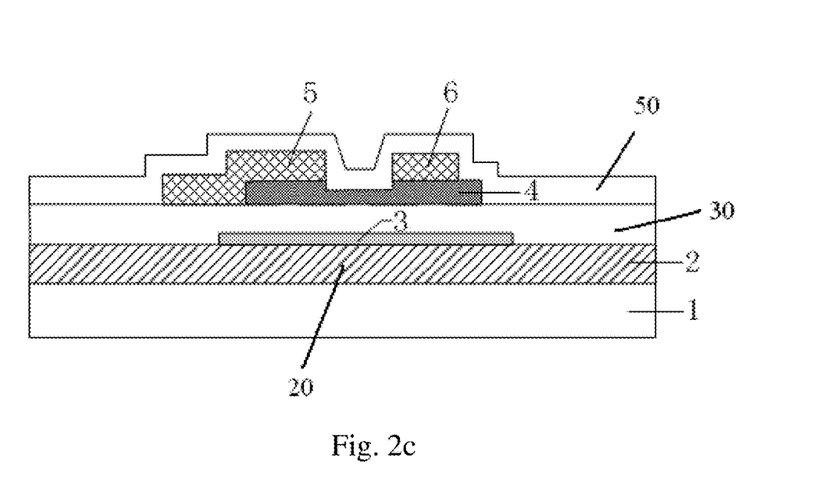

In a specific implementation, in the thin film transistor array substrate provided in an embodiment of the present disclosure, as illustrated in FIG. 2b, the transparent electrode layer 3 is disposed between the gate electrode 20 and the base substrate 1; or as illustrated in FIG. 2c, the transparent electrode layer 3 is disposed between the gate electrode 20 and the gate insulating layer 30. Furthermore, as illustrated in FIG. 2b and FIG. 2c, the passivation layer 50 is covered above the thin film transistor (which includes the source electrode 5 and the drain electrode 6). For example, the pixel electrode 12 is formed on the passivation layer 50 (referring to FIG. 2e), or the pixel electrode is formed on the gate insulating layer 30 and under the passivation layer 50.

Figure 2D:
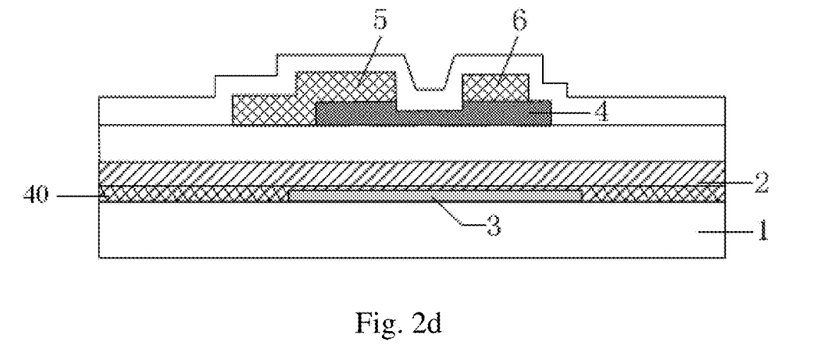

In a specific implementation, in the thin film transistor array substrate provided in an embodiment of the present disclosure, in order to improve the adhesion between the base substrate and the metal film disposed on the substrate, a buffer layer can be arranged between the substrate and the gate electrode. In this case, as illustrated in FIG. 2d, the transparent electrode layer 3 is disposed between the base substrate 1 and the buffer layer 40. In a specific implementation process, the position of the transparent electrode layer is not limited to the positions as illustrated in the drawings of the present disclosure, without limitation effect.

In a specific implementation, in the thin film transistor array substrate provided in one embodiment of the present disclosure, as illustrated in FIG. 2a to FIG. 2d, the thin film transistor array substrate further comprises a plurality of gate lines 2 disposed on the transparent electrode layer 3, and a portion of each of the gate lines 2 is used as the gate electrode 20 of the thin film transistor, so that the process can be simplified and the cost can be saved.

Figure 3A:
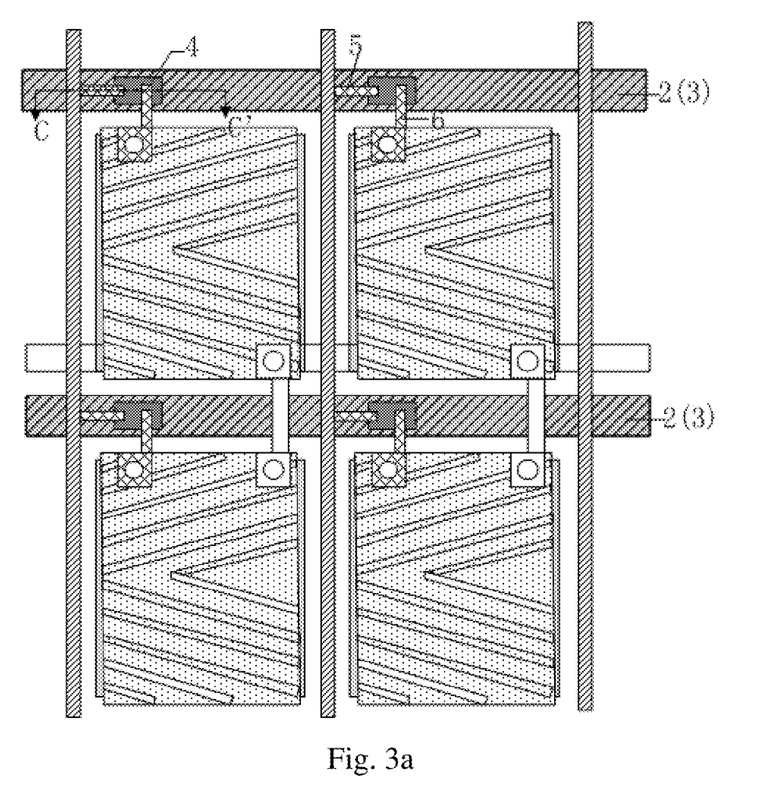
FIG. 3a is another top view of a thin film transistor array substrate provided by an embodiment of the present disclosure.
Figure 3B:
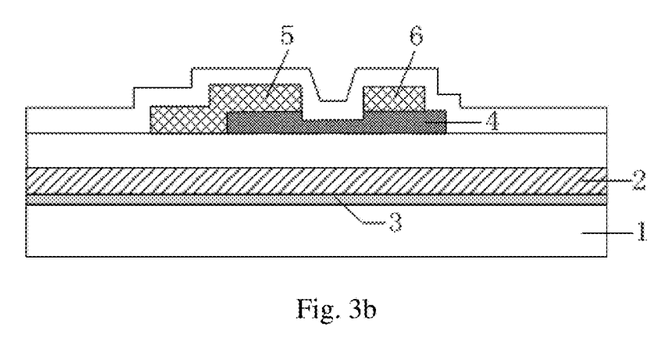
FIG. 3b is a sectional schematic structure diagram of the thin film transistor array substrate illustrated in FIG. 3a along the direction C-C'.

In a specific implementation, in the thin film transistor array substrate provided in an embodiment of the present disclosure, in the case that a portion of each of the gate lines is used as the gate electrode of the thin film transistor, for reducing a mask plate in the patterning process, specially, as illustrated in FIG. 3a to FIG. 3b, the orthogonal projection of the gate line on the base substrate overlaps with the orthogonal projection of the transparent electrode layer on the base substrate, thus, an additional fabrication process is not required in the preparation of the thin film transistor array substrate, after an electrode layer film and a metal layer film are deposited on the base substrate, only one patterning process (such as a semi-transparent membrane mask process or a single slit mask process) is required to form the patterns of the transparent electrode layer and the gate lines, so that the process can be simplified and the cost can be reduced. In order not to affect the display effect, as illustrated in FIG. 3b, the transparent electrode layer 3 is disposed between the gate lines 2 and the base substrate 1.

Figure 2E:
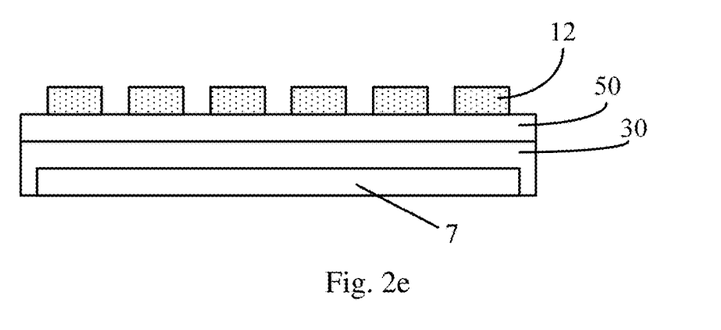
FIG. 2e is a sectional schematic structure diagram of the thin film transistor array substrate illustrated in FIG. 2a along the direction C-C'.

For example, in a specific implementation, the thin film transistor array substrate provided in an embodiment of the present disclosure can be applied to an advanced-super dimension switch (ADS) liquid crystal panel, for example, in the thin film transistor array substrate, the common electrode in a shape of plate is located in a lower layer (closer to the base substrate), and the pixel electrode in a shape having slits is located in an upper layer (closer to the liquid crystal layer). As illustrated in FIG. 2e, the pixel electrode 12 is disposed above the common electrode 7, and the insulating layer is disposed between the pixel electrode 12 and the common electrode 7. In this case, the common electrode and the transparent electrode layer are prepared in a same layer. Thus, an additional fabrication process is not required in the preparation of a thin film transistor array substrate, only one patterning process is required to form the patterns of the transparent electrode layer and the common electrode, so that the cost can be reduced and the additional value of the products is brought. The residual in the region where the thin film transistor is located is also reduced, and the phenomenon of unevenly displayed image caused by the residual can be avoided.

Figure 2F:
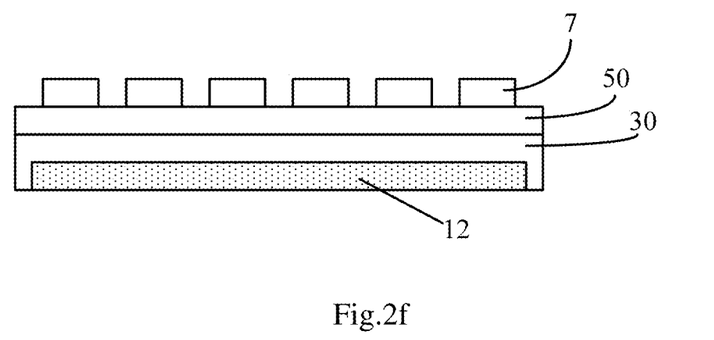
FIG. 2f is a variant of the embodiment illustrated in FIG. 2e.

For example, in a specific implementation, the thin film transistor array substrate provided in an embodiment of the present disclosure can also be applied to a high advanced-super dimension switch (HADS) liquid crystal panel, in the thin film transistor array substrate, the pixel electrode in a shape of plate is located in a lower layer (closer to the base substrate), and the common electrode in a shape having slits is located in an upper layer (closer to the liquid crystal layer). As illustrated in FIG. 2f, the pixel electrode 12 is disposed under the common electrode 7, and the insulating layer is disposed between the pixel electrode 12 and the common electrode 7. In this case, the pixel electrode and the transparent electrode layer are prepared in a same layer. Thus, an additional fabrication process is not required in the preparation of a thin film transistor array substrate, only one patterning process is required to form the patterns of the transparent electrode layer and the pixel electrode, so that the cost is reduced and the additional value of the products is brought. The residual in the region where the thin film transistor is located is also reduced, and the phenomenon of unevenly displayed image caused by the residual can be avoided.

In a specific implementation, in the thin film transistor array substrate provided in an embodiment of the present disclosure, for example, the material of the transparent electrode layer is anyone or any combination of indium tin oxide, indium zinc oxide or indium gallium zinc. The material of the transparent electrode layer can be selected reasonably to further avoid the electrode layer residual within the region where the thin film transistor is located.

In a specific implementation, in the thin film transistor array substrate provided in an embodiment of the present disclosure, for example, the transparent electrode layer is a plate electrode having a shape of rectangular, so that the etching process is simplified. The shape of the transparent electrode layer can also be in other regular pattern(s), as long as the requirement is met that the orthogonal projection of the active layer on the base substrate locates within the region of the orthogonal projection of the transparent electrode layer on the base substrate.

In a specific implementation, in the thin film transistor array substrate provided in an embodiment of the present disclosure, for example, a thickness of the transparent electrode layer can range from 300 Å to 1000 Å, which further ensures that the electrode layer residual in the region where the thin film transistor is located can be avoided.

In a specific implementation, the thin film transistor array substrate provided in an embodiment of the present disclosure can further include the gate insulating layer, an ohmic contact layer, a passivation layer and other layer(s), and common electrode lines, data lines and other structures may further formed on the base substrate, and the specific structures can have a variety of forms, without limitation upon the present application.

At least one embodiment of the present disclosure further provides a manufacturing method of the thin film transistor array substrate described above, the principle of this method for solving the problems is similar to that of the thin film transistor array substrate described above, so the implementations of the method can refer to those of the thin film transistor array substrates, and redundant descriptions will be omitted here.

Figure 4:
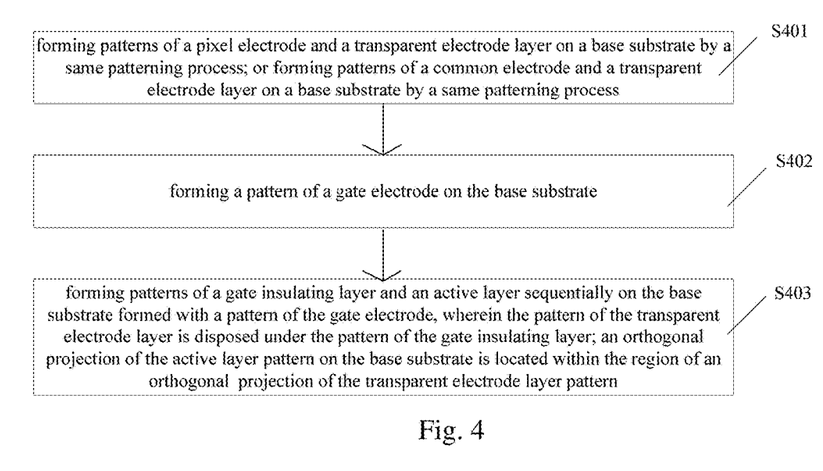
FIG. 4 is a flow chart of a manufacturing method of a thin film transistor array substrate provided by an embodiment of the present disclosure.

In a specific implementation, in the manufacturing method of the thin film transistor array substrate provided in an embodiment of the present disclosure, as illustrated in FIG. 4, for example, the method comprises the following operations:

S401: forming patterns of a pixel electrode and a transparent electrode layer on a base substrate by a same patterning process; or forming patterns of a common electrode and a transparent electrode layer on a base substrate by a same patterning process;

S402: forming a pattern of a gate electrode on the base substrate;

S403: forming patterns of a gate insulating layer and an active layer sequentially on the base substrate formed with the pattern of gate electrode, wherein the pattern of the transparent electrode layer is disposed under the pattern of the gate insulating layer, and an orthogonal projection of the active layer pattern on the base substrate is located within the region of an orthogonal projection of the transparent electrode layer pattern.

It should be noted that, the step S401 and the step S402 can be interchanged, in the case that the transparent electrode layer is disposed under the gate electrode, step S401 is performed firstly, then step S402 is performed; in the case that the transparent electrode layer is disposed between the gate electrode and the gate insulating layer, step S402 is performed firstly, then step S401 is performed. In step S402, in forming the gate electrode, the gate line which is electrically connected with the gate electrode can be formed at the same time.

In the manufacturing method of the thin film transistor array substrate provided in an embodiment of the present disclosure, because the transparent electrode layer, which is prepared in a same layer and by a same material as the pixel electrode or the common electrode, is disposed directly under the active layer, and the orthogonal projection of the active layer on the base substrate is located within the region of the orthogonal projection of the transparent electrode layer, the residual in the region where the thin film transistor is located is reduced, and the phenomenon of unevenly displayed image caused by the residual is avoided. The method is simple and has little influence on the gate resistance, so that it can improve the quality of the resultant product.

Figure 5A:
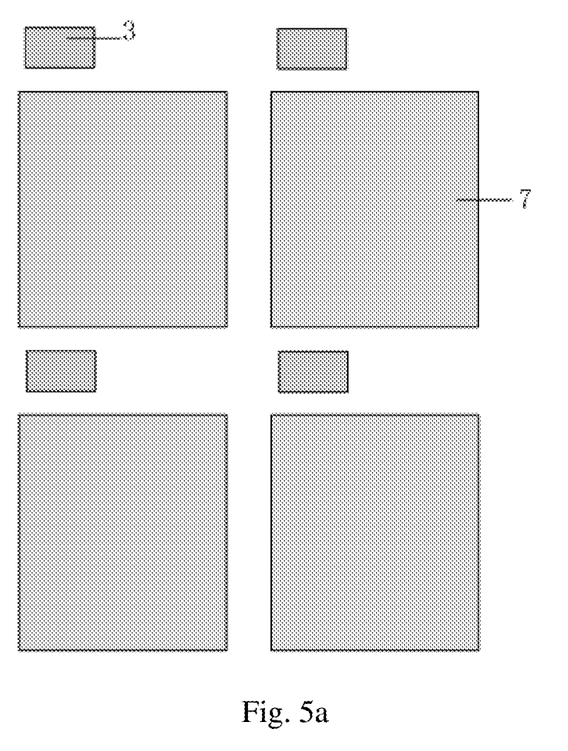
FIG. 5a to FIG. 5f are schematic structure diagrams of the thin film transistor array substrate after each step performed respectively provided by an embodiment of the present disclosure.

The following is a detailed example of a manufacturing method of the thin film transistor array substrate provided in an embodiment of the present disclosure, and the method comprises the following operations:

Step 1: forming patterns of a common electrode and a transparent electrode layer on a base substrate by a same patterning process, as illustrated in FIG. 5a. For example, an electrode layer film is deposited on the base substrate in a sputtering method or a thermal evaporation method, and a thickness of the electrode layer film ranges from 300 Å to 1000 Å. The material of the electrode layer film includes indium tin oxide (ITO), indium zinc oxide (IZO) or other metal and metal oxide(s); by means of a single exposure and a wet etching process, the patterns of the common electrode 7 and a transparent electrode layer 3 are formed, the electrode layer film in the region corresponding to the thin film transistor needs to be remained as the transparent electrode layer 3.

Figure 5B:
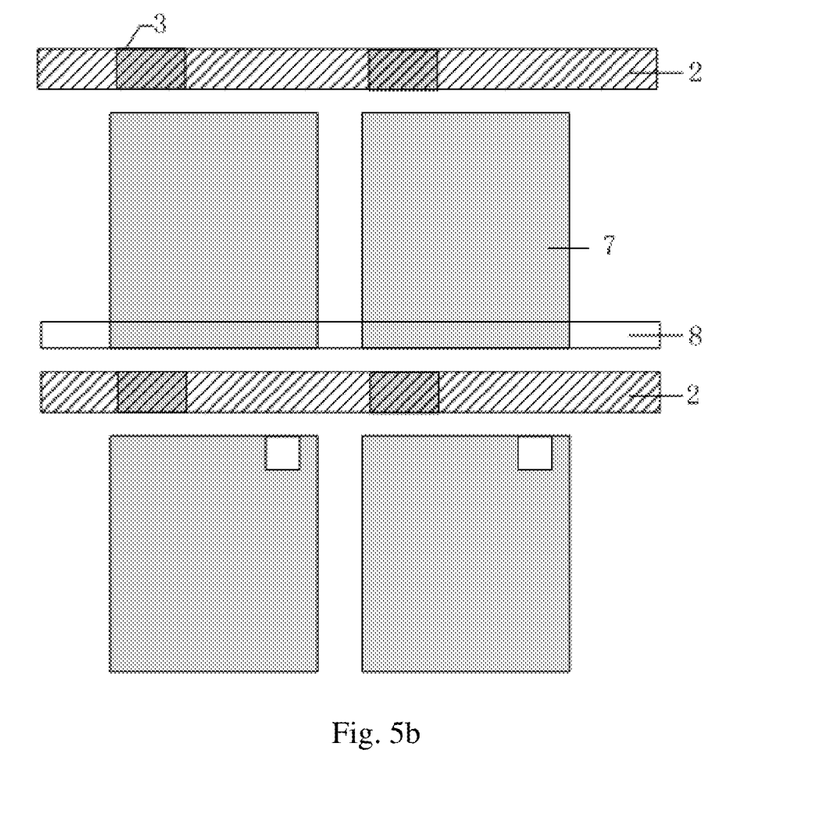

Step 2: forming patterns of gate lines on the base substrate disposed with the patterns of common electrode and the transparent electrode layer, as illustrated in FIG. 5b. For example, a buffer layer film and a metal layer film are deposited on the base substrate in the sputtering method or the thermal evaporation method, and the thickness of the buffer layer film ranges from 100 Å to 1000 Å, the material of the buffer layer film includes Ta, Cr, Mo, W, Nb or other metal or alloy, or a transparent conductive film; the thickness of the metal layer film ranges from 1000 Å to 5000 Å, and the material of the metal layer film is aluminum or copper. Photoresist is coated on the metal layer film, and the processes of exposing, developing, wet etching and stripping of the photoresist are conducted to obtain the patterns corresponding to the gate lines 2 and common electrode lines 8 (connected with the common electrode in the low layer). A portion of each of the gate lines is used as the gate electrode of a thin film transistor.

Figure 5C:
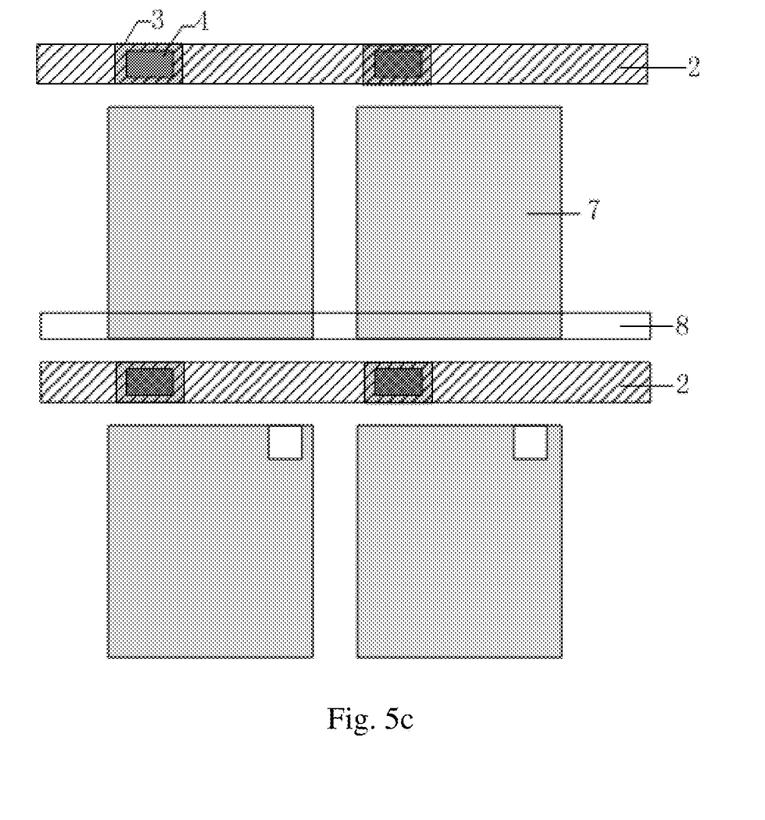

Step 3: forming patterns of a gate insulating layer and an active layer sequentially on the base substrate, as illustrated in FIG. 5c. For example, a gate insulating layer film, an active layer film 4, and an ohmic contact layer film are sequentially deposited in a PECVD method on the base substrate after Step 2 is performed. The thickness of the gate insulating layer film ranges from 1000 Å to 4000 Å, and the material of the gate insulating layer includes nitride ($SiN_x$) or oxynitride ($SiO_xN_x$), or a compound of nitride ($SiN_x$) and oxynitride ($SiO_xN_x$). The thickness of the active layer film ranges from 1000 Å to 4000 Å. The thickness of the ohmic contact layer film ranges from 500 Å to 1000 Å. Then the processes of coating photoresist, exposing, developing, dry etching and stripping of the photoresist are conducted to obtain a channel of the thin film transistor. The orthogonal projection area of the active layer 4 on the substrate is slightly smaller than that of the positive electrode layer 3.

Figure 5D:
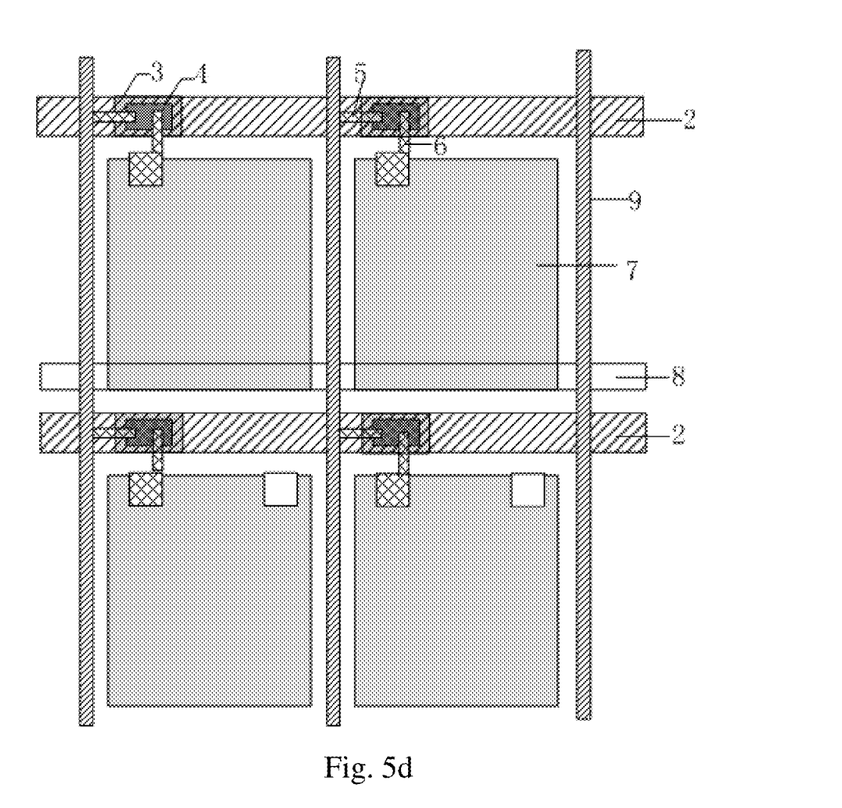

Step 4: Forming the patterns of the source electrode and the drain electrode on the base substrate disposed with the active layer pattern, as illustrated in FIG. 5d. For example, a metal layer film including Ta, Cr, Mo, W, Nb or other metal or alloy or a transparent conductive film is deposited in a sputtering method or a thermal evaporation method as a buffer layer on the base substrate after Step 3 is performed, and then a metal layer with a thickness ranging from 1000 Å to 5000 Å is deposited, and the material of the metal layer film is aluminum or copper. The processes of coating photoresist, exposing, developing, wet etching and stripping of the photoresist are conducted to obtain the patterns of the source electrode 5, the drain electrode 6 and the data scanning lines 9.

Figure 5E:
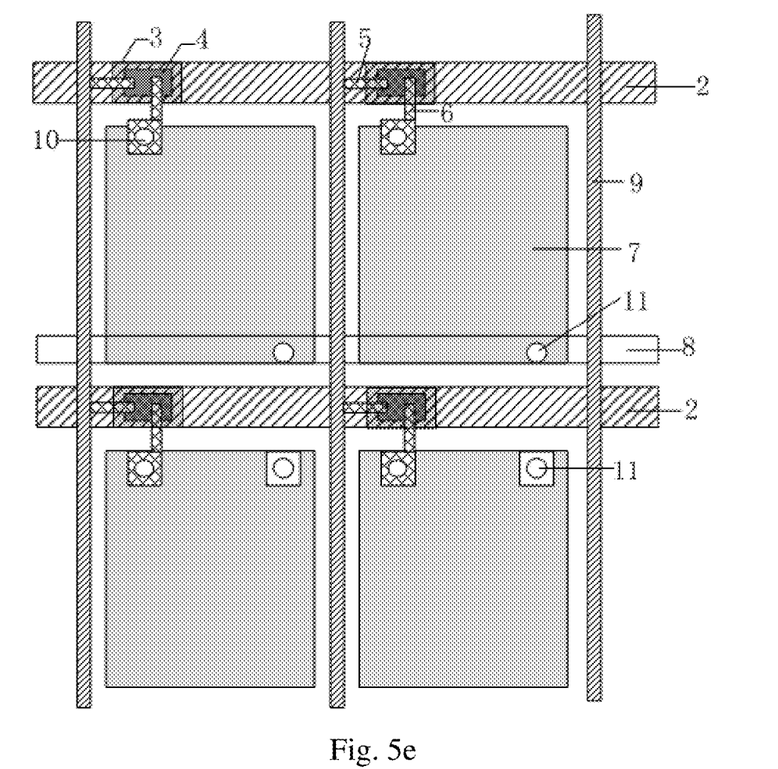

Step 5: forming a pattern of the passivation layer having via holes on the base substrate formed with the source electrode and the drain electrode, as illustrated in FIG. 5e. For example, a passivation layer is deposited in a PECVD method on the base substrate after Step 4 is performed, the thickness of the passivation layer ranges from 700 Å to 5000 Å, and the material of the passivation layer includes oxide, nitride, oxynitride or the like. Then the processes of coating photoresist, exposing, developing, dry etching and stripping of the photoresist are conducted to form via holes 10 (removing the passivation layer) in the pixel regions in the passivation layer, and form connection holes 11 (removing the passivation layer and the gate insulating layer) which are used for connecting common electrodes 7 (common electrode line 8) in previous and next rows.

Figure 5F:
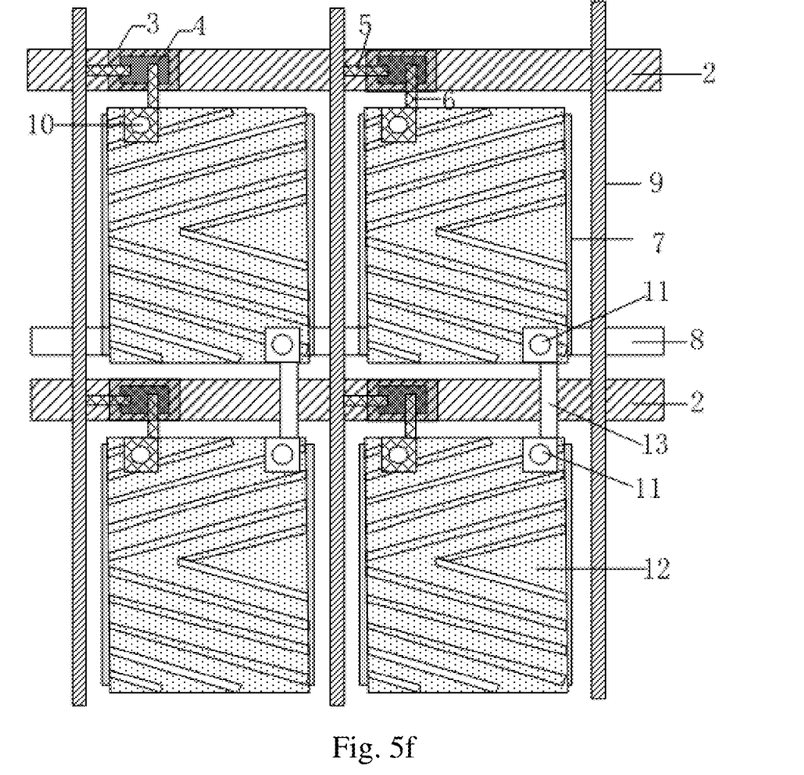

Step 6: forming a pattern of the pixel electrode on the base substrate formed with the passivation layer pattern, as illustrated in FIG. 5f. For example, a transparent conductive layer is deposited on the base substrate in the sputtering method or the thermal evaporation method, and the thickness of the transparent conductive layer ranges from 300 Å to 1000 Å, the material of the transparent conductive layer includes indium tin oxide (ITO), indium zinc oxide (IZO) or other metal and metal oxide(s); then a pixel electrode 12 and a conductive connection layer 13 configured for connecting the common electrodes 7 (common electrode line 8) in previous and next rows through a single exposure and an etching process.

It should be noted that, the manufacturing process comprises six exposure processes; in addition, five exposure processes can also be used for manufacturing the thin film transistor array substrate. That is, in the case of performing the step 3, after the gate insulating layer film, the active layer film, and the ohmic contact layer film are sequentially deposited through a plasma enhanced chemical vapor deposition (PECVD) method, the exposing and etching process are not performed, but followed by depositing a buffer layer and a metal layer through the method of sputtering or evaporation; subsequently, the patterns of the gate insulating layer, the semiconductor layer, the ohmic contact layer, and the source electrode metal layer and the drain electrode metal layer are formed through exposing and developing processes by a half tone mask or a gray tone mask, and after multiple operations of etching, for example, the patterns including the channel, the source electrode, and the drain electrode of the thin film transistor and data lines are formed.

Thus, the thin film transistor array substrate provided in at least one embodiment of the present disclosure is fabricated through the operations of step 1 to step 6.

At least one embodiment of the present disclosure further provides a display device, and the display device includes the thin film transistor array substrate according to any one of the above-mentioned embodiments of the present disclosure. The display device can be: a mobile phone, a tablet computer, a television, a display, a notebook computer, a digital picture frame, a navigation system, or any other product or component having a display function. For the display device, it should be understood for those skilled in the art, other essential parts of the display device should be equipped, detailed descriptions therefor will be omitted here, and it should not be a limitation upon the present disclosure. The embodiments of the display device can refer to those of the thin film transistor array substrates, and detailed descriptions will be omitted here.

At least one embodiment of the present disclosure provides a thin film transistor array substrate, a manufacturing method thereof and a display device, and the thin film transistor array substrate comprises: a base substrate, a gate electrode disposed on the base substrate, a gate insulating layer and an active layer which are disposed on the gate electrode sequentially, and a pixel electrode, a common electrode, and a transparent electrode layer which are disposed on the base substrate; the transparent electrode layer and the pixel electrode are prepared in a same layer and by a same material, or the transparent electrode layer and the common electrode are prepared in a same layer and by a same material of the transparent electrode layer; the transparent electrode layer is disposed under the gate insulating layer; an orthogonal projection of the active layer on the base substrate is located within the region of an orthogonal projection of the transparent electrode layer. Because the transparent electrode layer, which is prepared in a same layer and a same material as the pixel electrode or the common electrode, is disposed directly under the active layer, the residual in the region where the thin film transistor is located is reduced, so that the surface of the active layer is smooth, and the phenomenon of unevenly displayed image caused by the residual can be avoided. The method is simple and has little influence on the gate resistance, so that it can improve the quality of the product.

What are described above is related to the illustrative embodiments of the disclosure only and not limitative to the scope of the disclosure; the scopes of the disclosure are defined by the accompanying claims.

The present application claims the priority of the Chinese Patent Application No. 201510518773.3 filed on Aug. 21, 2015, which is incorporated herein by reference as part of the disclosure of the present application.

What is claimed is:

1. A thin film transistor array substrate, comprising:
a base substrate;
a gate electrode disposed on the base substrate;
a gate insulating layer and an active layer which are disposed on the gate electrode sequentially; and
a pixel electrode, a common electrode, and a transparent electrode layer which are disposed on the base substrate,
wherein the transparent electrode layer and the pixel electrode are prepared in a same layer and a material of the transparent electrode layer is the same as a material of the pixel electrode, or the transparent electrode layer and the common electrode are prepared in a same layer and a material of the transparent electrode layer is the same as a material of the common electrode;
the transparent electrode layer is disposed under the gate insulating layer;
an orthogonal projection of the active layer on the base substrate is entirely located within a region of an orthogonal projection of the transparent electrode layer; and
a buffer layer is disposed between the base substrate and the gate electrode, wherein the transparent electrode layer is disposed between the base substrate and the buffer layer.

2. The thin film transistor array substrate according to claim 1, further comprising: a plurality of gate lines disposed on the transparent electrode layer, wherein a portion of each of the gate lines is configured as the gate electrode.

3. The thin film transistor array substrate according to claim 2, wherein an orthogonal projection of the gate lines on the base substrate overlaps with the orthogonal projection of the transparent electrode layer on the base substrate.

4. The thin film transistor array substrate according to claim 1, wherein the pixel electrode is disposed above the common electrode, and the common electrode is a plate electrode.

5. The thin film transistor array substrate according to claim 1, wherein the pixel electrode is disposed under the common electrode, and the pixel electrode is a plate electrode.

6. The thin film transistor array substrate according to claim 1, wherein the material of the transparent electrode layer is one or more of indium tin oxide, indium zinc oxide and indium gallium zinc.

7. The thin film transistor array substrate according to claim 1, wherein the transparent electrode layer is a plate electrode having a rectangular shape.

8. The thin film transistor array substrate according to claim 1, wherein a thickness of the transparent electrode layer ranges from 300 Å to 1000 Å.

9. A display device, comprising the thin film transistor array substrate according to claim 1.

10. A manufacturing method of a thin film transistor array substrate, comprising:

forming patterns of a pixel electrode and a transparent electrode layer on a base substrate by a same patterning process, or forming patterns of a common electrode and a transparent electrode layer on a base substrate by a same patterning process;

forming a buffer layer on the transparent electrode layer;

forming a pattern of a gate electrode on the base substrate; and forming patterns of a gate insulating layer and an active layer sequentially on the base substrate formed with the pattern of the gate electrode, wherein the pattern of the transparent electrode layer is disposed under the pattern of the gate insulating layer, an orthogonal projection of the pattern of the active layer on the base substrate is entirely located in a region of an orthogonal projection of the pattern of the transparent electrode layer, the buffer layer is disposed between the base substrate and the gate electrode, and the transparent electrode layer is disposed between the base substrate and the buffer layer.

11. The manufacturing method according to claim 10, further comprising:

forming, on the active layer, a source electrode and a drain electrode which are connected to the active layer; and forming a data line which is electrically connected with one of the source electrode and the drain electrode.

12. The manufacturing method according to claim 11, further comprising:

forming a pixel electrode which is electrically connected to the other one of the source electrode and the drain electrode.

13. The thin film transistor array substrate according to claim 1, wherein at least a portion of the buffer layer is in direct contact with the transparent electrode layer, and at least a portion of the buffer layer is in direct contact with the base substrate.

* * * * *